(12) United States Patent
Echikawa et al.

(10) Patent No.: US 11,605,873 B2
(45) Date of Patent: Mar. 14, 2023

(54) SUBSTRATE WITH ANTENNA, AND ANTENNA MODULE

(71) Applicant: Murata Manufacturing Co., Ltd., Kyoto (JP)

(72) Inventors: Yoshitaka Echikawa, Kyoto (JP); Issei Yamamoto, Kyoto (JP); Ikuo Deguchi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 163 days.

(21) Appl. No.: 16/928,365

(22) Filed: Jul. 14, 2020

(65) Prior Publication Data

US 2020/0343618 A1    Oct. 29, 2020

Related U.S. Application Data

(63) Continuation of application No. PCT/JP2019/000873, filed on Jan. 15, 2019.

(30) Foreign Application Priority Data

Jan. 18, 2018   (JP) .............................. JP2018-006427

(51) Int. Cl.
*H01Q 1/22* (2006.01)
*H01Q 1/12* (2006.01)
*H05K 1/02* (2006.01)

(52) U.S. Cl.
CPC ............. *H01Q 1/12* (2013.01); *H05K 1/0243* (2013.01); *H05K 2201/0191* (2013.01); *H05K 2201/09045* (2013.01); *H05K 2201/10098* (2013.01)

(58) Field of Classification Search
CPC ....... H05K 1/0243; H05K 2201/09045; H05K 2201/10098; H01Q 1/24–38; H01Q 1/22
See application file for complete search history.

(56) References Cited

U.S. PATENT DOCUMENTS

| | | | |
|---|---|---|---|
| 10,446,919 B2 * | 10/2019 | Shiozaki | ................ H01Q 1/005 |
| 2008/0266178 A1 | 10/2008 | Tiezzi et al. | |
| 2019/0089044 A1 * | 3/2019 | Kobuke | ............. H01L 21/4807 |

FOREIGN PATENT DOCUMENTS

| | | |
|---|---|---|
| CN | 203983493 U | 12/2014 |
| CN | 204156090 U | 2/2015 |
| JP | H03173203 A | 7/1991 |
| JP | 2001298321 A | 10/2001 |

(Continued)

OTHER PUBLICATIONS

International Search Report issued in Application No. PCT/JP2019/000873, dated Mar. 19, 2019.

(Continued)

*Primary Examiner* — Hasan Islam
(74) *Attorney, Agent, or Firm* — Pearne & Gordon LLP

(57) ABSTRACT

A substrate with an antenna according to the present disclosure includes a circuit board having one main surface and the other main surface, and an antenna element mounted on the one main surface of the circuit board. When viewed from a thickness direction, an area of the one main surface of the circuit board is larger than an area of the other main surface, and the antenna element is mounted on at least a part of a region that is on the one main surface of the circuit board and that protrudes from the other main surface.

18 Claims, 4 Drawing Sheets

(56) References Cited

FOREIGN PATENT DOCUMENTS

| JP | 2003283239 A | 10/2003 |
|----|--------------|---------|
| JP | 2008515253 A | 5/2008  |
| JP | 2011035493 A | 2/2011  |
| JP | 2017034293 A | 2/2017  |

OTHER PUBLICATIONS

Written Opinion issued in Application No. PCT/JP2019/000873, dated Mar. 19, 2019.
Chinese Office action for 201980008566 dated Mar. 3, 2022.

* cited by examiner

SUBSTRATE WITH ANTENNA, AND ANTENNA MODULE

This is a continuation of International Application No. PCT/JP2019/000873 filed on Jan. 15, 2019 which claims priority from Japanese Patent Application No. 2018-006427 filed on Jan. 18, 2018. The contents of these applications are incorporated herein by reference in their entireties.

BACKGROUND OF THE DISCLOSURE

Field of the Disclosure

The present disclosure relates to a substrate with an antenna and an antenna module.

Description of the Related Art

As a structure of a substrate with an antenna that is a substrate on which an antenna element is mounted, for example, Patent Document 1 discloses a structure in which an upper surface of an antenna element is inclined with respect to a mounting surface.

Patent Document 1: Japanese Unexamined Patent Application Publication No. 2017-34293

BRIEF SUMMARY OF THE DISCLOSURE

In the structure described in Patent Document 1, an antenna region is secured by providing the antenna region with an inclination.

However, since the upper surface of the antenna element is inclined with respect to the mounting surface, the height of the entire module is increased, which prevents the height thereof from being reduced. Further, the presence of the inclined surface requires special equipment in mounting of the antenna element, and therefore, there is also a problem in that the productivity of the module is low.

The present disclosure has been made to solve the above-described problem, and an object of the present disclosure is to provide a substrate with an antenna that has a large area in which an antenna element can be mounted and that secures a space for mounting other electronic components when mounted on a mounting substrate as an antenna module. An object of the present disclosure is also to provide an antenna module in which an electronic component is mounted on the substrate with the antenna.

A substrate with an antenna according to the present disclosure includes a circuit board having one main surface and the other main surface, and an antenna element mounted on the one main surface of the circuit board. When viewed from a thickness direction, an area of the one main surface of the circuit board is larger than an area of the other main surface, and the antenna element is mounted on at least a part of a region that is on the one main surface of the circuit board and that protrudes from the other main surface.

In one embodiment, the circuit board includes a dielectric layer configuring the one main surface, and a base material layer configuring the other main surface. The dielectric layer has a relative dielectric constant lower than that of the base material layer. Further, the dielectric layer has a central portion in contact with the base material layer, and a peripheral portion positioned outside of the central portion.

It is preferable that the peripheral portion be thinner than the central portion. Further, the peripheral portion may have the same thickness as that of the central portion.

In one embodiment, the circuit board includes a dielectric layer configuring the one main surface and the other main surface.

It is preferable that the dielectric layer be formed by laminating a plurality of layers.

The dielectric layer may be formed by laminating two or more kinds of layers having different relative dielectric constants, and the layer configuring the one main surface may have the lowest relative dielectric constant among the layers in the dielectric layer.

In the substrate with the antenna according to the present disclosure, it is preferable that a stepped portion between a portion of the circuit board that protrudes and a portion of the circuit board that does not protrude have a chamfered shape.

An antenna module according to the present disclosure includes a substrate with an antenna that is mounted with an antenna element on one main surface of a circuit board, and an electronic component mounted on the substrate with the antenna, and the substrate with the antenna is the substrate with the antenna according to the present disclosure.

In the antenna module according to the present disclosure, it is preferable that the electronic component be mounted on the other main surface of the circuit board.

According to the present disclosure, it is possible to provide a substrate with an antenna that has a large area in which an antenna element can be mounted, and that secures a space for mounting other electronic components when mounted on a mounting substrate as an antenna module.

DETAILED DESCRIPTION OF THE DISCLOSURE

Figure 1:
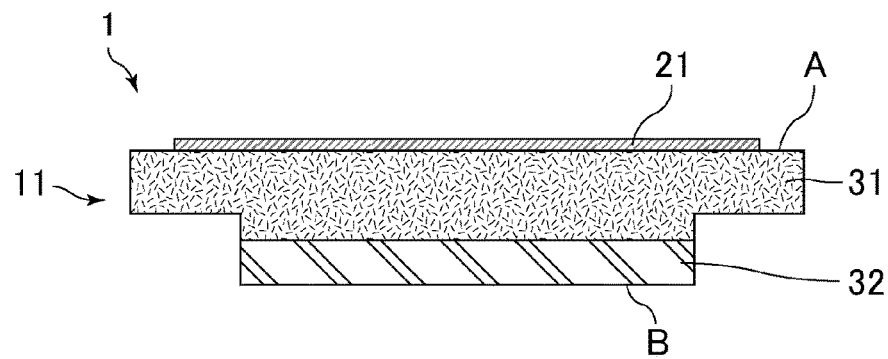
FIG. 1 is a cross-sectional view schematically illustrating an example of a substrate with an antenna according to a first embodiment of the present disclosure.

Hereinafter, a substrate with an antenna and an antenna module according to the present disclosure will be described.

However, the present disclosure is not limited to the following configurations, and it is possible to apply the present disclosure by appropriately changing the configurations without departing from the spirit and scope of the present disclosure. Note that a combination of two or more of the respective desirable configurations of the present disclosure to be described below is also included in the present disclosure.

[Substrate with Antenna]

In a substrate with an antenna according to the present disclosure, when viewed from a thickness direction, an area of one main surface of a circuit board is larger than an area of the other main surface, and an antenna element is mounted on at least a part of a region that is on the one main surface of the circuit board and that protrudes from the other main surface.

When an antenna module including the substrate with the antenna according to the present disclosure is mounted on a mounting substrate, the other main surface of the circuit board is normally a mounting surface (terminal surface) with respect to the mounting substrate. Therefore, by making the area of the one main surface of the circuit board larger than the area of the other main surface, it is possible to make an area that can be mounted with the antenna element larger than that of an antenna module whose both main surfaces have the same area, while a mounting area is kept the same.

Further, by mounting the antenna element on a portion of the circuit board that protrudes, the antenna element can be set close to an air region having a low relative dielectric constant.

As a result, in the substrate with the antenna according to the present disclosure, it is possible to improve the antenna characteristics.

In addition, when the antenna module is produced using the substrate with the antenna according to the present disclosure, there is a space below the portion of the circuit board that protrudes. Therefore, when the antenna module is mounted on the mounting substrate, it is possible to secure a space for mounting other electronic components, and thus, it is possible to effectively utilize the space on the mounting substrate.

The embodiments to be described below are mere examples, and it goes without saying that partial substitutions or combinations of configurations to be described in the different embodiments may be possible. In a second embodiment and subsequent embodiments, descriptions of matters common to those in a first embodiment will be omitted, and only different points will be described. In particular, similar working effects according to a similar configuration will not be described in each embodiment.

First Embodiment

In the first embodiment of the present disclosure, a circuit board includes a dielectric layer configuring one main surface and a base material layer configuring the other main surface, and a peripheral portion of the dielectric layer is thinner than a central portion.

FIG. 1 is a cross-sectional view schematically illustrating an example of a substrate with an antenna according to the first embodiment of the present disclosure.

A substrate with an antenna 1 illustrated in FIG. 1 includes a circuit board 11 and an antenna element 21. The circuit board 11 has one main surface A and the other main surface B, and the antenna element 21 is mounted on the one main surface A of the circuit board 11. The circuit board 11 includes a dielectric layer 31 configuring the one main surface A, and a base material layer 32 configuring the other main surface B.

Although not illustrated in FIG. 1, a desired circuit is formed in the substrate 1 with the antenna.

In the substrate with the antenna 1 illustrated in FIG. 1, when viewed from a thickness direction (a vertical direction in FIG. 1), an area of the one main surface A of the circuit board 11 is larger than an area of the other main surface B. In addition, the antenna element 21 is mounted on a part of a region that is on the one main surface A of the circuit board 11 and that protrudes from the other main surface B.

Note that "the other main surface of the circuit board" means a surface positioned farthest away from the one main surface of the circuit board among surfaces on a side opposite to the one main surface of the circuit board on which the antenna element is mounted. Therefore, a rear surface of a portion of the circuit board that protrudes is not included in the other main surface of the circuit board.

In the substrate with the antenna according to the first embodiment of the present disclosure, the size, shape, and the like of a region where the one main surface of the circuit board protrudes from the other main surface are not particularly limited as long as the area of the one main surface of the circuit board is larger than the area of the other main surface.

Figure 2A:
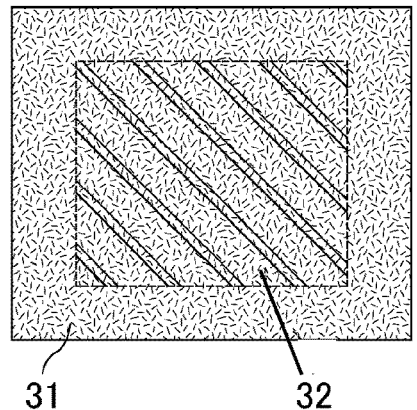
FIG. 2A and FIG. 2B are plan views schematically illustrating an example of one main surface of a circuit board viewed from a thickness direction.
Figure 2B:

FIG. 2A and FIG. 2B are plan views schematically illustrating an example of the one main surface of the circuit board viewed from the thickness direction.

In FIG. 2A, the dielectric layer 31 configuring the one main surface of the circuit board protrudes from four sides of the base material layer 32 configuring the other main surface of the circuit board. On the other hand, in FIG. 2B, the dielectric layer 31 configuring the one main surface of the circuit board protrudes from two sides of the base material layer 32 configuring the other main surface of the circuit board.

In this way, when planar shapes of the one main surface and the other main surface of the circuit board are rectangular, the one main surface of the circuit board may protrude from four sides of the other main surface of the circuit board, may protrude from three sides, may protrude from two sides, or may protrude from one side. When the one main surface of the circuit board protrudes from two sides of the other main surface, the one main surface may protrude from two sides facing with each other, or may protrude from two sides adjacent to each other. Further, the one main surface of the circuit board may protrude from a part of a side of the other main surface of the circuit board.

In the substrate with the antenna according to the first embodiment of the present disclosure, the antenna element may be mounted on at least a part of the region that is on the one main surface of the circuit board and that protrudes from the other main surface. That is, the antenna element may be mounted on a part of the region that protrudes, or the antenna element may be mounted on all over the region that protrudes.

As long as the antenna element is mounted on at least a part of the region that protrudes, the size, shape, and the like of the antenna element are not particularly limited. Further, a position at which the antenna element is mounted is not particularly limited on the one main surface of the circuit board. For example, the antenna element may be mounted in a center portion of the one main surface of the circuit board, or may be mounted on an end portion of the one main surface of the circuit board.

The antenna element may be mounted on an entire region that does not protrude from the other main surface, in addition to the region that is on the one main surface of the circuit board and that protrudes from the other main surface, or may be mounted on a part of the region that does not protrude from the other main surface.

Note that the antenna element may be formed of one pattern or may be formed of a plurality of patterns.

In the substrate with the antenna according to the first embodiment of the present disclosure, as illustrated in FIG. 1, the circuit board includes the dielectric layer configuring the one main surface and the base material layer configuring the other main surface. The dielectric layer has a lower relative dielectric constant than that of the base material layer. By bonding the antenna element with the dielectric layer having the relatively low relative dielectric constant, a loss of a signal can be suppressed, and thus the antenna characteristics are improved.

In the substrate with the antenna according to the first embodiment of the present disclosure, the dielectric layer has the central portion in contact with the base material layer and the peripheral portion positioned in an outer side portion outside of the central portion, and the peripheral portion is thinner than the central portion.

By making the peripheral portion of the circuit board thinner than the central portion, the antenna element can be set close to an air region having a low relative dielectric constant, compared to a case where the peripheral portion has the same thickness as that of the central portion, and thus the antenna characteristics are improved.

Further, since a space can be secured below the portion of the circuit board that protrudes, a degree of freedom in design is improved.

Figure 3:
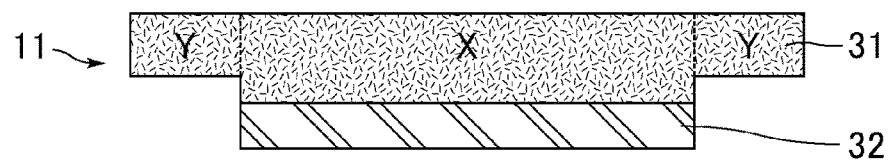
FIG. 3 is a cross-sectional view schematically illustrating an example of the circuit board configuring the substrate with the antenna illustrated in FIG. 1.

FIG. 3 is a cross-sectional view schematically illustrating an example of the circuit board configuring the substrate with the antenna illustrated in FIG. 1.

As illustrated in FIG. 3, a central portion X of the dielectric layer 31 configuring the circuit board 11 is a portion in contact with the base material layer 32, and a peripheral portion Y of the dielectric layer 31 is a portion positioned outside of the central portion X. In FIG. 3, the peripheral portion Y is thinner than the central portion X.

Examples of a material configuring the base material layer include a ceramic material, or a resin material, and the like that configure a general printed circuit board.

As a ceramic material configuring the base material layer, for example, a low temperature co-fired ceramic (LTCC) material may be used. The low temperature co-fired ceramic material refers to a material capable of being sintered at a firing temperature equal to or lower than 1000° C. and capable of being co-fired with copper, silver, and the like, among ceramic materials.

Examples of the low temperature co-fired ceramic material include a glass composite-based low temperature co-fired ceramic material obtained by mixing a ceramic material such as quartz, alumina, and forsterite with borosilicate glass, a crystallized glass-based low temperature co-fired ceramic material using $ZnO$—$MgO$—$Al_2O_3$—$SiO_2$-based crystallized glass, a non-glass-based low temperature co-fired ceramic material using a $BaO$—$Al_2O_3$—$SiO_2$-based ceramic material, and an $Al_2O_3$—$CaO$—$SiO_2$—$MgO$—$B_2O_3$-based ceramic material, and the like.

The relative dielectric constant of the base material layer is, for example, equal to or larger than 3 and equal to or smaller than 20.

A thickness of the base material layer is not particularly limited, and is, for example, equal to or larger than 100 μm and equal to or smaller than 1000 μm.

A material configuring the dielectric layer is preferably a resin material. Examples of such a resin material include a fluorine-based resin, a silicone rubber, a hydrocarbon-based resin having few polar groups (for example, polyethylene, polypropylene, and polystyrene), and the like. More preferred specific examples include a fluorine-based resin having $\varepsilon_r \approx 2.6$, a silicone rubber having $\varepsilon_r \approx 3.0$, a polyethylene having $\varepsilon_r \approx 2.25$, a polypropylene having $\varepsilon_r \approx 2.2$, a polystyrene having $\varepsilon_r \approx 2.45$, and the like. Note that $\varepsilon_r$ represents a relative dielectric constant.

The relative dielectric constant of the dielectric layer is, for example, larger than or equal to 1.5 and smaller than 3.

A thickness of the dielectric layer is not particularly limited as long as the peripheral portion is thinner than the central portion, and a thickness of the central portion is, for example, equal to or larger than 30 μm and equal to or smaller than 500 μm, and a thickness of the peripheral portion is, for example, equal to or larger than 20 μm and smaller than 500 μm.

In the substrate with the antenna according to the first embodiment of the present disclosure, it is preferable that the dielectric layer configuring the circuit board be formed by laminating a plurality of layers.

By forming the dielectric layer in a laminated structure, it is possible to form a circuit in the dielectric layer. As a result, since the dielectric layer can secure an area larger than that of the base material layer, a degree of freedom in design for not only a layout of the antenna element but also a layout of the circuit is improved.

Figure 4:
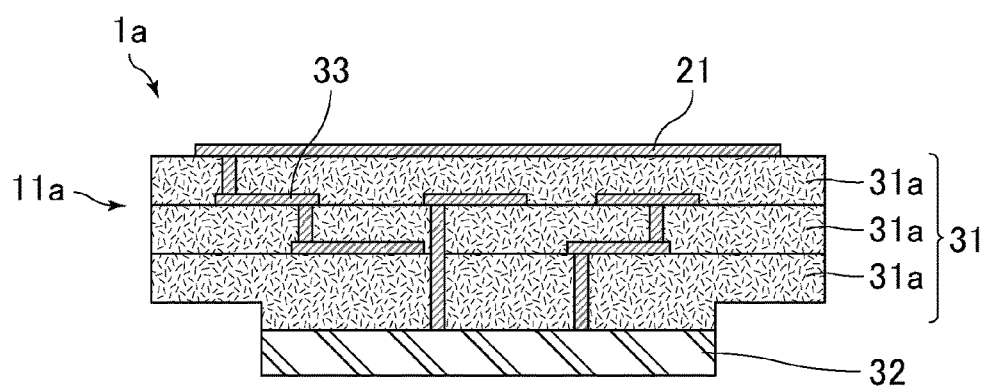
FIG. 4 is a cross-sectional view schematically illustrating an example of the substrate with the antenna that includes a dielectric layer having a laminated structure in the first embodiment of the present disclosure.

FIG. 4 is a cross-sectional view schematically illustrating an example of the substrate with the antenna including the dielectric layer having the laminated structure in the first embodiment of the present disclosure.

In a substrate with an antenna 1*a* illustrated in FIG. 4, a circuit board 11*a* includes the dielectric layer 31 and the base material layer 32. In FIG. 4, the dielectric layer 31 is formed by laminating three layers 31*a* having the same relative dielectric constant. Further, a circuit 33 is formed in the dielectric layer 31.

In the substrate with the antenna according to the first embodiment of the present disclosure, the dielectric layer configuring the circuit board may be formed by laminating two or more kinds of layers having different relative dielectric constants, and the layer configuring the one main surface of the circuit board may have the lowest relative dielectric constant among the layers in the dielectric layer.

For example, it is preferable that a layer having a high relative dielectric constant be provided other than the surface layer. In addition, it is also preferable that a layer having a high relative dielectric constant be sandwiched between layers having low relative dielectric constants.

By providing the layer having the high relative dielectric constant other than the surface layer, the strength of the substrate with the antenna can be reinforced.

Figure 5:
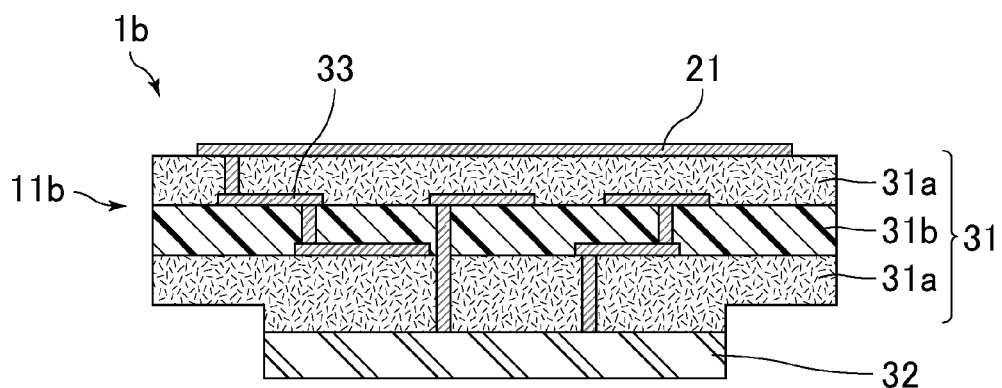
FIG. 5 is a cross-sectional view schematically illustrating another example of the substrate with the antenna that includes the dielectric layer having the laminated structure in the first embodiment of the present disclosure.

FIG. 5 is a cross-sectional view schematically illustrating another example of the substrate with the antenna including the dielectric layer having the laminated structure in the first embodiment of the present disclosure.

In a substrate with an antenna 1b illustrated in FIG. 5, a circuit board 11b includes the dielectric layer 31 and the base material layer 32. In FIG. 5, the dielectric layer 31 is formed by sandwiching a layer 31b having a high relative dielectric constant between the layers 31a having a low dielectric constant. Further, the circuit 33 is formed in the dielectric layer 31.

In the substrate with the antenna according to the first embodiment of the present disclosure, it is preferable that a stepped portion between the portion of the circuit board that protrudes and the portion of the circuit board that does not protrude have a chamfered shape.

In this case, since the stress due to thermal deformation is easily dispersed, the reliability such as impact resistance, and thermal shock resistance is improved.

The term "chamfered" as used herein means that a surface is formed in a recessed portion of the stepped portion, that is, a material is added to the cornered areas of the recessed portion of the stepped portion.

Figure 6:
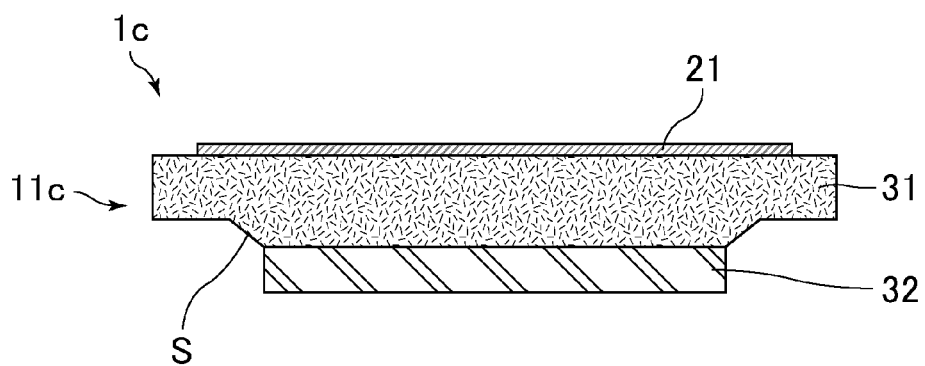
FIG. 6 is a cross-sectional view schematically illustrating an example of the substrate with the antenna in which a stepped portion has a chamfered shape in the first embodiment of the present disclosure.

FIG. 6 is a cross-sectional view schematically illustrating an example of the substrate with the antenna in which the stepped portion has a chamfered shape in the first embodiment of the present disclosure.

In a substrate with an antenna 1c illustrated in FIG. 6, a stepped portion S of a circuit board 11c has a C-chamfered shape in which a cross-section is represented by a straight line. In the substrate with the antenna 1c illustrated in FIG. 6, the stepped portion S is positioned in the dielectric layer 31, and the material of the dielectric layer 31 is added to the cornered areas of a recessed portion of the stepped portion S.

The chamfered shape of the stepped portion is not particularly limited, and examples thereof include a C-chamfered shape in which a cross-section is represented by a straight line, an R-chamfered shape in which a cross-section is represented by a curved line, and the like. Note that the stepped portion having the chamfered shape is formed by, for example, cutting processing, polishing processing, and the like.

Second Embodiment

In the second embodiment of the present disclosure, a circuit board includes a dielectric layer configuring one main surface and a base material layer configuring the other main surface, and a peripheral portion of the dielectric layer has the same thickness as that of a central portion thereof.

Figure 7:
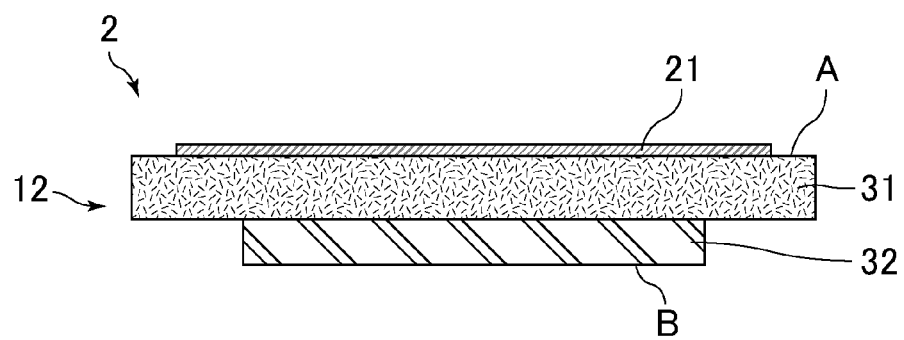
FIG. 7 is a cross-sectional view schematically illustrating an example of a substrate with an antenna according to a second embodiment of the present disclosure.

FIG. 7 is a cross-sectional view schematically illustrating an example of a substrate with an antenna according to the second embodiment of the present disclosure.

A substrate with an antenna 2 illustrated in FIG. 7 includes a circuit board 12 and the antenna element 21. The circuit board 12 has one main surface A and the other main surface B, and the antenna element 21 is mounted on the one main surface A of the circuit board 12. The circuit board 12 includes the dielectric layer 31 configuring the one main surface A, and the base material layer 32 configuring the other main surface B.

Although not illustrated in FIG. 7, a desired circuit is formed in the substrate with the antenna 2.

In the substrate with the antenna 2 illustrated in FIG. 7, when viewed from a thickness direction (a vertical direction in FIG. 7), an area of the one main surface A of the circuit board 12 is larger than an area of the other main surface B. In addition, the antenna element 21 is mounted on a part of a region that is on the one main surface A of the circuit board 12 and that protrudes from the other main surface B.

In the substrate with the antenna 2 illustrated in FIG. 7, the peripheral portion of the dielectric layer 31 has the same thickness as that of the central portion.

The substrate with the antenna according to the second embodiment of the present disclosure has a configuration common to that of the substrate with the antenna according to the first embodiment of the present disclosure, except that the peripheral portion of the dielectric layer has the same thickness as the central portion.

The thickness of the dielectric layer is not particularly limited as long as the thickness of the peripheral portion is the same as the thickness of the central portion, and the thickness is, for example, equal to or larger than 20 μm and equal to or smaller than 500 μm.

Note that, in the second embodiment of the present disclosure, it is acceptable that the thickness of the peripheral portion of the dielectric layer is not exactly the same as the thickness of the central portion of the dielectric layer. Specifically, the thickness of the peripheral portion of the dielectric layer only needs to fall within a range of about 5% of the thickness of the central portion of the dielectric layer.

In the substrate with the antenna according to the second embodiment of the present disclosure, it is preferable that the dielectric layer configuring the circuit board be formed by laminating a plurality of layers.

In the substrate with the antenna according to the second embodiment of the present disclosure, the dielectric layer configuring the circuit board may be formed by laminating two or more kinds of layers having different relative dielectric constants, and the layer configuring the one main surface of the circuit board may have the lowest relative dielectric constant among the layers in the dielectric layer.

In the substrate with the antenna according to the second embodiment of the present disclosure, it is preferable that a stepped portion between a portion of the circuit board that protrudes and a portion of the circuit board that does not protrude have a chamfered shape. For example, in the substrate with the antenna 2 illustrated in FIG. 7, it is preferable that a material of the base material layer 32 be added to the cornered areas of a recessed portion of the stepped portion positioned between the dielectric layer 31 and the base material layer 32.

Third Embodiment

In the third embodiment of the present disclosure, a circuit board includes a dielectric layer configuring one main surface and the other main surface.

Figure 8:
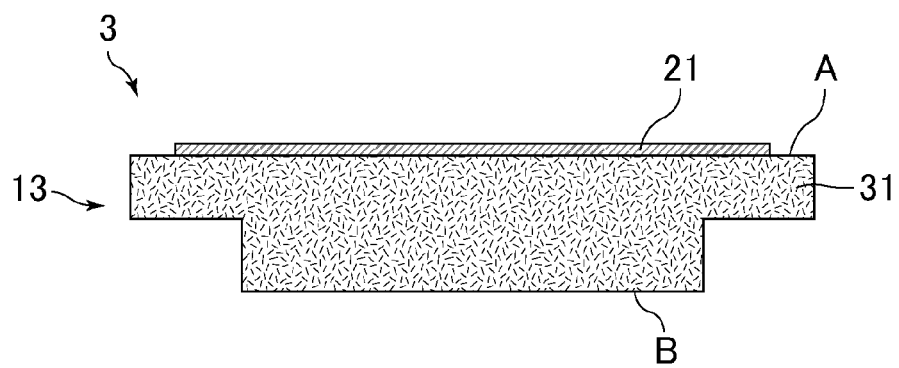
FIG. 8 is a cross-sectional view schematically illustrating an example of a substrate with an antenna according to a third embodiment of the present disclosure.

FIG. 8 is a cross-sectional view schematically illustrating an example of a substrate with an antenna according to the third embodiment of the present disclosure.

A substrate with an antenna 3 illustrated in FIG. 8 includes a circuit board 13 and the antenna element 21. The circuit board 13 has one main surface A and the other main surface B, and the antenna element 21 is mounted on the one main surface A of the circuit board 13. The circuit board 13 includes the dielectric layer 31 configuring the one main surface A and the other main surface B.

Although not illustrated in FIG. 8, a desired circuit is formed in the substrate with the antenna 3.

In the substrate with the antenna 3 illustrated in FIG. 8, when viewed from a thickness direction (a vertical direction in FIG. 8), an area of the one main surface A of the circuit board 13 is larger than an area of the other main surface B. In addition, the antenna element 21 is mounted on a part of a region that is on the one main surface A of the circuit board 13 and that protrudes from the other main surface B.

The substrate with the antenna according to the third embodiment of the present disclosure has a configuration common to the substrate with the antenna according to the first embodiment of the present disclosure, except that the circuit board does not include a base material layer.

A thickness of the dielectric layer is not particularly limited, and a thickness of a portion that protrudes is, for example, equal to or larger than 20 μm and equal to or smaller than 500 μm, and a thickness of a portion that does not protrude is, for example, equal to or larger than 100 μm and equal to or smaller than 1000 μm.

In the substrate with the antenna according to the third embodiment of the present disclosure, it is preferable that the dielectric layer configuring the circuit board be formed by laminating a plurality of layers.

In the substrate with the antenna according to the third embodiment of the present disclosure, the dielectric layer configuring the circuit board may be formed by laminating two or more kinds of layers having different relative dielectric constants, and the layer configuring the one main surface of the circuit board may have the lowest relative dielectric constant among the layers in the dielectric layer.

In the substrate with the antenna according to the third embodiment of the present disclosure, it is preferable that a stepped portion between the portion of the circuit board that protrudes and the portion of the circuit board that does not protrude have a chamfered shape. For example, in the substrate with the antenna 3 illustrated in FIG. 8, it is preferable that a material of the dielectric layer 31 be added to the cornered areas of a recessed portion of the stepped portion positioned in the dielectric layer 31.

[Antenna Module]

An antenna module according to the present disclosure includes a substrate with an antenna, and an electronic component mounted on the substrate with the antenna, and as the substrate with the antenna, the substrate with the antenna according to the present disclosure is provided.

In the substrate with the antenna according to the present disclosure, there is a space below the portion of the circuit board that protrudes. Therefore, when the antenna module according to the present disclosure is mounted on a mounting substrate, a space for mounting other electronic components can be secured, and the space on the mounting substrate can be effectively utilized.

Figure 9:
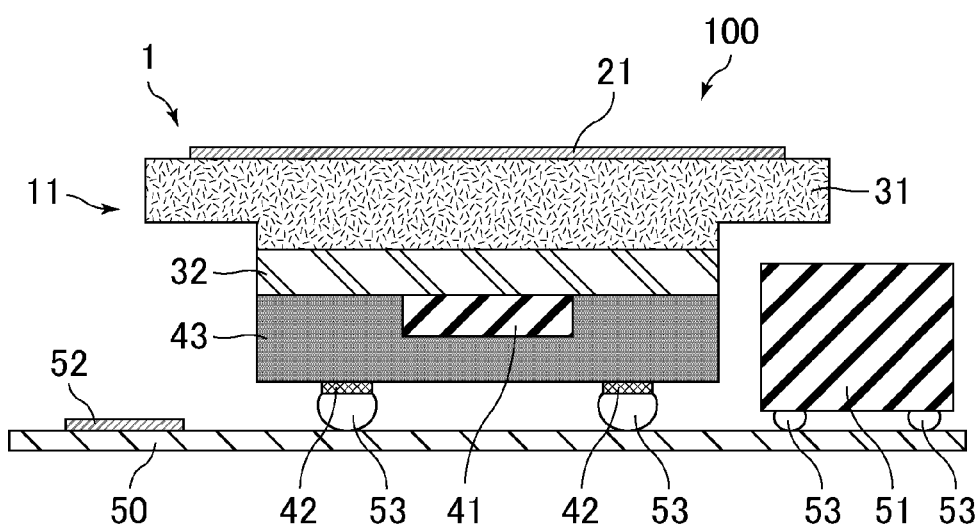
FIG. 9 is a cross-sectional view schematically illustrating an example of a state in which an antenna module according to the present disclosure is mounted on a mounting substrate.

FIG. 9 is a cross-sectional view schematically illustrating an example of a state in which the antenna module according to the present disclosure is mounted on a mounting substrate. FIG. 9 illustrates an antenna module using the substrate with the antenna 1 illustrated in FIG. 1 as an example of the antenna module according to the present disclosure.

An antenna module 100 illustrated in FIG. 9 includes the substrate with the antenna 1 in which the antenna element 21 is mounted on one main surface of the circuit board 11, and an electronic component 41 mounted on the substrate with the antenna 1. The configuration of the substrate with the antenna 1 is as described with reference to FIG. 1.

In the antenna module 100 illustrated in FIG. 9, the electronic component 41 is mounted on the other main surface of the circuit board 11, that is, on the main surface on a side opposite to the main surface on which the antenna element 21 is mounted. The electronic component 41 is mounted on the circuit board 11 with a bonding material (not illustrated) such as solder interposed therebetween.

In the antenna module 100 illustrated in FIG. 9, external terminals 42 are further provided on the other main surface of the circuit board 11. Further, the electronic component 41 is sealed by a sealing material 43.

In FIG. 9, the antenna module 100 is mounted on a mounting substrate 50. Another electronic component 51 is mounted on the mounting substrate 50, and a surface wiring 52 is provided on the mounting substrate 50. The antenna module 100 and the other electronic component 51 are mounted on the mounting substrate 50 with bonding materials 53 such as solder interposed therebetween.

Examples of the electronic component mounted on the substrate with the antenna and the electronic component mounted on the mounting substrate include a surface mount component (SMC) such as an integrated circuit (IC). From the viewpoint of increasing an effective area of the antenna element, the electronic component mounted on the substrate with the antenna is preferably mounted on the other main surface of the circuit board.

Similarly to the electronic component, the external terminals provided on the substrate with the antenna are preferably provided on the other main surface of the circuit board.

Such an antenna module can be suitably used for, for example, next-generation radio base stations and mobile phones for 5G, or WiGig, or the like.

The substrate with the antenna and the antenna module according to the present disclosure are preferably produced as follows. Hereinafter, description will be made of production examples of the substrate with the antenna according to the first embodiment of the present disclosure and the antenna module including the substrate with the antenna.

Production Example 1

(1) A film serving as a dielectric layer is adhered to a surface of a base material layer. An area of the film to be adhered to the base material layer is approximately equal to an area of the base material layer.

As the base material layer, a general printed circuit board, LTCC substrate, polyimide sheet, or the like can be used.

As the film serving as the dielectric layer, for example, a film containing the above-described resin material, or the like as a main component can be used.

The film serving as the dielectric layer is adhered through a process such as heating and pressurizing, or UV irradiating.

(2) One or more films serving as the dielectric layer are further laminated on the film adhered to the base material layer. An area of the film to be laminated is larger than the area of the base material layer. This can make an area of one main surface of a circuit board be larger than an area of the other main surface.

Further, an antenna element is formed on the film to be laminated as the outermost layer. At this time, the antenna element is formed such that the antenna element is mounted on a portion of the circuit board that protrudes. Accordingly, it is possible to secure a large antenna area with respect to a mounting area.

The antenna element is formed by photolithography, plating, pressure bonding, or the like. The antenna element may be formed before laminating or after laminating.

As described above, a substrate with an antenna is obtained.

(3) On the main surface on a side opposite to the surface on which the antenna element is formed, of the obtained substrate with the antenna, an electronic component such as an IC is mounted and external terminals are also formed. Further, the mounting surface is sealed with resin by using a sealing material.

The electronic component may be mounted by using a general mounting process. In addition, in sealing with resin, a process such as transfer molding, compression molding, or dipping in liquid resin can be used.

(4) As necessary, washing, printing, measurement, appearance check, and packaging are performed and then shipment is carried out. As described above, an antenna module is obtained.

Production Example 2

(1) An antenna element is formed on a film serving as a dielectric layer. At this time, the antenna element is formed such that the antenna element is mounted on a portion to become a portion of the circuit board that protrudes in a subsequent process.

(2) The film on which the antenna element is formed is adhered to a surface of a base material layer.

(3) On a main surface on a side opposite to the surface on which the antenna element is formed, an electronic component such as an IC is mounted and external terminals are also formed. Further, a mounting surface is sealed with resin by using a sealing material. As described above, a module product is obtained.

(4) The obtained module product is cut with a dicing machine. First, the obtained module product is cut with a blade having a large width from a side of the terminal surface. However, instead of being completely diced, with a part of the dielectric layer left, the individual pieces are connected by the dielectric layer. The left dielectric layer becomes the portion of the circuit board that protrudes.

(5) Next, cutting is performed with a blade having a width smaller than the width at the first cutting, and the dicing is completely performed. Since a difference in width is provided by using the thick blade and the thin blade, a step is formed, and thus an area of one main surface of the circuit board can be made larger than an area of the other main surface.

(6) The diced module is cleaned, printed, measured, checked for appearance, and packaged as necessary, and is shipped. As described above, an antenna module is obtained.

The substrate with the antenna and the antenna module according to the present disclosure are not limited to the above-described embodiments, and it is possible to apply various applications and modifications within the scope of the present disclosure, for example, regarding the configuration, production conditions, and the like of the substrate with the antenna.

EXAMPLES

Hereinafter, examples in which the substrate with the antenna and the antenna module according to the present disclosure are more specifically disclosed will be described. It should be noted that the present disclosure is not limited to these examples only.

[Production of Substrate with Antenna]

Under the conditions shown in Table 1, substrates with antennas having a similar structure to those in FIG. 1 or FIG. 7 were produced.

The structure of the produced substrates with the antennas will be described below.

Material of base material layer: LTCC ($\varepsilon$=7 to 8)
Thickness of base material layer: 1 mm
Area of base material layer (terminal surface): 3 mm×3 mm
Material of dielectric layer: fluorine-based resin
Thickness of dielectric layer: 1 mm (central portion), 1 mm or 0.2 mm (peripheral portion)
Area of dielectric layer: refer to Table 1
Area of antenna element: refer to Table 1

Figure 10:
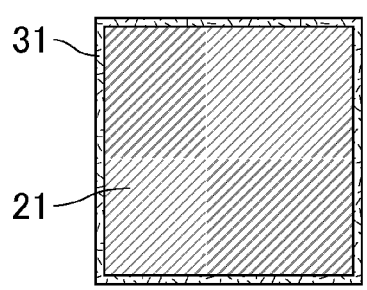
FIG. 10 is a plan view of a substrate with an antenna produced under Condition 1.
Figure 11:
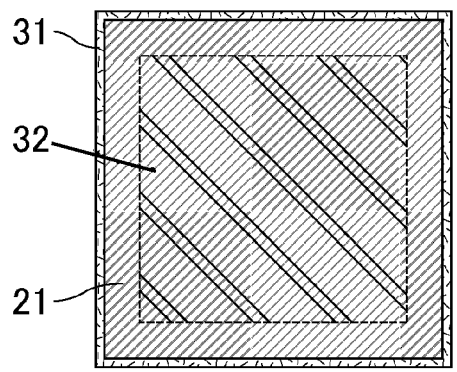
FIG. 11 is a plan view of a substrate with an antenna produced under Condition 6.

FIG. 10 is a plan view of a substrate with an antenna produced under Condition 1, and FIG. 11 is a plan view of a substrate with an antenna produced under Condition 6.

In Conditions 1 to 6, the area of the base material layer 32 was made constant, and the area of the dielectric layer 31 and the area of the antenna element 21 were changed in each condition. Note that the antenna element 21 was disposed at a center portion of the dielectric layer 31 in all the conditions.

Figure 12:
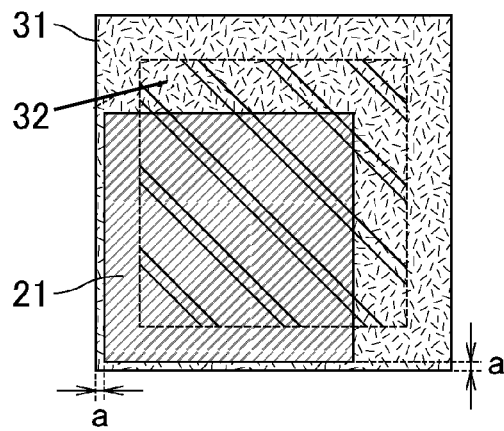
FIG. 12 is a plan view of a substrate with an antenna produced under Condition 7.

FIG. 12 is a plan view of a substrate with an antenna produced under Condition 7.

In Condition 7, the area of the dielectric layer 31, the area of the base material layer 32, and the area of the antenna element 21 were similar to those in Condition 2 except that the antenna element 21 was disposed at an end portion of the dielectric layer 31. Note that intervals between the antenna element 21 and the dielectric layer 31 (the lengths indicated by "a" in FIG. 12) were 0.2 mm.

Condition 8 was similar to Condition 7 except that the thickness of the peripheral portion of the dielectric layer was changed to 0.2 mm.

Condition 9 was similar to Condition 1 except that the relative dielectric constant of the dielectric layer was increased.

[Evaluation of Antenna Characteristics]

Antenna modules were produced by using the obtained substrates with the antennas. A specific signal was transmitted from a signal transmission device to each antenna module, and a signal intensity when the signal was received was checked.

The signal intensities under Conditions 2 to 9 were compared with each other with respect to the signal intensity under Condition 1. With respect to the signal intensity under Condition 1, the case where the signal intensity was smaller than 100% was determined as "x" (poor), the case where the signal intensity was larger than or equal to 100% and smaller than 105% was determined as "Δ" (acceptable), and the case where the signal intensity was equal to or larger than 105% was determined as "○" (good).

TABLE 1

| Condition | Area of Base Material Layer (mm) | Dielectric Layer ε | Thickness of Central Portion (mm) | Thickness of Peripheral Portion (mm) | Area of Dielectric Layer (mm) | Area of Antenna (mm) | Antenna Position | Signal Intensity Ratio (with respect to Condition 1) | Determination |
|---|---|---|---|---|---|---|---|---|---|
| *1 | 3 × 3 | 2.5 | 1 | 1 | 3 × 3 | 2.8 × 2.8 | Center Portion | 100% | — |

TABLE 1-continued

| Condition | Area of Base Material Layer (mm) | Dielectric Layer ε | Thickness of Central Portion (mm) | Thickness of Peripheral Portion (mm) | Area of Dielectric Layer (mm) | Area of Antenna (mm) | Antenna Position | Signal Intensity Ratio (with respect to Condition 1) | Determination |
|---|---|---|---|---|---|---|---|---|---|
| *2 | | | | | 4 × 4 | 2.8 × 2.8 | Center Portion | 100% | Δ |
| *3 | | | | | 3.1 × 3.1 | 2.9 × 2.9 | Center Portion | 103% | Δ |
| 4 | | | | | 3.3 × 3.3 | 3.1 × 3.1 | Center Portion | 114% | ○ |
| 5 | | | | | 3.5 × 3.5 | 3.3 × 3.3 | Center Portion | 137% | ○ |
| 6 | | | | | 4 × 4 | 3.8 × 3.8 | Center Portion | 171% | ○ |
| 7 | | | | | 4 × 4 | 2.8 × 2.8 | End Portion | 106% | ○ |
| 8 | | | | 0.2 | 4 × 4 | 2.8 × 2.8 | End Portion | 111% | ○ |
| *9 | | 7 | | 1 | 3 × 3 | 2.8 × 2.8 | Center Portion | 63% | × |

In Table 1, the conditions to which * is added are for comparative examples outside the scope of the present disclosure.

In Conditions 2 to 8, since the area of the dielectric layer was larger than the area of the base material layer, a region protruding from the other main surface was present on the one main surface of the circuit board.

However, under Condition 2 in which the area of the antenna element was the same as that in Condition 1, it was not possible to obtain an effect of improving the antenna characteristics. In addition, under Condition 3 in which the area of the antenna element was larger than that in Condition 1 but in which the antenna element was not mounted in the protruding region, it was not possible to sufficiently obtain an effect of improving the antenna characteristics.

On the other hand, under Conditions 4 to 6 in which the antenna element was mounted in the protruding region, the antenna characteristics were improved compared to those under Condition 1. Note that the area and the signal intensity of the antenna element were substantially proportional to each other.

Under Condition 7 in which the antenna element was disposed at the end portion of the dielectric layer although the area of the antenna element was the same as that in the Condition 1, the antenna element was mounted in the protruding region, and therefore, unlike under Condition 2, the antenna characteristics were improved.

Further, under Condition 8 in which the peripheral portion of the dielectric layer was thinner than the central portion thereof, the antenna characteristics were improved compared to those under Condition 7.

Under Condition 9 in which the relative dielectric constant of the dielectric layer was high, the antenna characteristics were lower than those under Condition 1.

1, 1a, 1b, 1c, 2, 3 SUBSTRATE WITH ANTENNA
11, 11a, 11b, 11c, 12, 13 CIRCUIT BOARD
21 ANTENNA ELEMENT
31, 31a, 31b DIELECTRIC LAYER
32 BASE MATERIAL LAYER
33 CIRCUIT
41 ELECTRONIC COMPONENT (ELECTRONIC COMPONENT MOUNTED ON SUBSTRATE WITH ANTENNA)
42 EXTERNAL TERMINAL
43 SEALING MATERIAL
50 MOUNTING SUBSTRATE
51 ELECTRONIC COMPONENT (ELECTRONIC COMPONENT MOUNTED ON MOUNTING SUBSTRATE)
52 SURFACE WIRING
53 BONDING MATERIAL
100 ANTENNA MODULE
A ONE MAIN SURFACE OF CIRCUIT BOARD
B THE OTHER MAIN SURFACE OF CIRCUIT BOARD
S STEPPED PORTION
X CENTRAL PORTION OF DIELECTRIC LAYER
Y PERIPHERAL PORTION OF DIELECTRIC LAYER

The invention claimed is:

1. An antenna comprising:
a circuit board having one main surface and another main surface; and
an antenna element mounted on the one main surface of the circuit board, wherein
when viewed from a thickness direction, an area of the one main surface of the circuit board is larger than another area of the other main surface,
the circuit board includes
a dielectric layer configuring the one main surface, and
a base material layer configuring the other main surface,
the dielectric layer has a first relative dielectric constant lower than a second relative dielectric constant of the base material layer,
the dielectric layer has
a central portion in contact with the base material layer, and
a peripheral portion positioned outside of the central portion, and
a region on which the antenna element is mounted on includes the central portion and at least a part of the peripheral portion.

2. The antenna according to claim 1, wherein the peripheral portion is thinner than the central portion.

3. The antenna according to claim 1, wherein the peripheral portion has the same thickness as the central portion.

4. The antenna according to claim 1, wherein the circuit board includes a dielectric layer configuring the one main surface and the other main surface.

5. The antenna according to claim 1, wherein
the dielectric layer comprises a plurality of laminated layers.

6. The antenna according to claim 1, wherein
the dielectric layer comprises two or more kinds of laminated layers having different relative dielectric constants, and a layer configuring the one main surface has the lowest relative dielectric constant among layers in the dielectric layer.

7. The antenna according to claim 1, wherein
a stepped portion between a portion of the circuit board protruding and a portion of the circuit board not protruding has a chamfered shape.

8. The antenna according to claim 2, wherein
the dielectric layer comprises a plurality of laminated layers.

9. The antenna according to claim 3, wherein
the dielectric layer comprises a plurality of laminated layers.

10. The antenna according to claim 4, wherein
the dielectric layer comprises a plurality of laminated layers.

11. The antenna according to claim 2, wherein
the dielectric layer comprises two or more kinds of laminated layers having different relative dielectric constants, and a layer configuring the one main surface has the lowest relative dielectric constant among layers in the dielectric layer.

12. The antenna according to claim 3, wherein
the dielectric layer comprises two or more kinds of laminated layers having different relative dielectric constants, and a layer configuring the one main surface has the lowest relative dielectric constant among layers in the dielectric layer.

13. The antenna according to claim 4,
wherein the dielectric layer comprises two or more kinds of laminated layers having different relative dielectric constants, and a layer configuring the one main surface has the lowest relative dielectric constant among layers in the dielectric layer.

14. The antenna according to claim 2, wherein
a stepped portion between a portion of the circuit board protruding and a portion of the circuit board not protruding has a chamfered shape.

15. The antenna according to claim 3, wherein
a stepped portion between a portion of the circuit board protruding and a portion of the circuit board not protruding has a chamfered shape.

16. The antenna according to claim 4, wherein
a stepped portion between a portion of the circuit board protruding and a portion of the circuit board not protruding has a chamfered shape.

17. An antenna module comprising: the antenna according to claim 1; and
an electronic component mounted on the antenna.

18. The antenna module according to claim 17, wherein the electronic component is mounted on the other main surface of the circuit board.

* * * * *